United States Patent [19]

Carlsson

[11] Patent Number: 4,558,762

[45] Date of Patent: Dec. 17, 1985

[54] LOUDSPEAKER

[76] Inventor: Stig Carlsson, Torkel Knutssonsgatan 15, S-117 25 Stockholm, Sweden

[21] Appl. No.: 443,941

[22] Filed: Nov. 23, 1982

[30] Foreign Application Priority Data

Nov. 26, 1981 [SE] Sweden ................................ 8107049

[51] Int. Cl.[4] ................................................ H05K 5/02

[52] U.S. Cl. .................................... 181/147; 181/152; 181/199

[58] Field of Search ................................ 181/144–147, 181/150–156, 175, 199; 381/87–90

[56] References Cited

U.S. PATENT DOCUMENTS

| | | | |
|---|---|---|---|
| 2,993,557 | 7/1961 | Miller et al. | 181/147 |
| 3,203,502 | 8/1965 | Rife | 181/156 |
| 3,360,072 | 12/1967 | Carlsson | 181/147 |
| 4,006,308 | 2/1977 | Ponsgen | 181/147 X |
| 4,006,311 | 2/1977 | Carlsson | 181/147 X |
| 4,073,365 | 2/1978 | Johnson | 181/147 |
| 4,112,256 | 9/1978 | Carlsson | 181/154 X |
| 4,138,594 | 2/1979 | Klipsch | 181/152 X |
| 4,365,688 | 12/1982 | Blose | 181/145 |

*Primary Examiner*—L. T. Hix

*Assistant Examiner*—Brian W. Brown

*Attorney, Agent, or Firm*—Burmeister, York, Palmatier, Hamby & Jones

[57] ABSTRACT

A loudspeaker is provided for high-quality stereophonic loudspeaker systems intended to be positioned on the floor close to a vertical wall of a room. The aim is to reduce distortion due to that part of the reflected sound which arrives from substantially the same direction as the direct sound. Therefore the sound radiating surfaces and the loudspeaker casing are so arranged that the reflected sound from the floor and the wall arrives substantially in phase with the direct sound up to at least 800 Hz.

The loudspeaker has a casing with a side wall (2), a top wall (4) and a bottom wall (6). A loudspeaker unit (7) in the side wall (2) is the sound source for at least the range from 50 to 150 Hz. A loudspeaker unit (9) mounted in a horn-type casing structure close to the bottom wall (6) is the sound source for at least the range from 300 to 800 Hz. A loudspeaker unit (12) located near the rear end of the top wall (4) and facing slantwise forwards towards the side wall (2) is the sound source for the direct sound at higher frequencies.

The left-hand and the right-hand loudspeakers form a mirror-image pair. In preferred embodiments the higher-frequency loudspeaker unit (12) co-operates with a horn-type structure (16, 17, 18, 19*a*, 19*b*) to avoid reflected sound from the room wall in the mid-range up to about 4 kHz.

18 Claims, 5 Drawing Figures

LOUDSPEAKER

This invention relates to loudspeakers for high-quality stereophonic loudspeaker systems intended to be positioned on the floor close to a wall of a room.

The quality of reproduction which a loudspeaker of this type can provide in a room is known to be influenced by the loudspeaker's interaction with adjacent reflecting boundary surfaces in the room, and especially by the reflected sound from the wall behind the loudspeaker and from the floor. At frequencies low enough to make the reflected sound arrive substantially in phase with the direct sound, the reflected sound increases the efficiency of the loudspeaker. At higher frequencies, however, when the phase angle between direct and reflected sound is greater than about 120 degrees, i.e. when the distance travelled by the reflected sound exceeds that of the direct sound by more than one third of a wave-length, the resulting sound as a function of frequency will alternate between minima and maxima. In this frequency range the reflected sound from the wall and from the floor distorts not only the amplitude response in the frequency domain but also the amplitude response in the time domain.

I have found that the reflected sound which arrives out of phase with the direct sound from substantially the same direction as the direct sound tends to degrade the tonal quality and the definition of the sound reproduced. It also tends to mask the details of the spatial information provided by good stereophonic recordings. Several loudspeakers are known which are designed to make the reflected sound from the wall and the floor arrive substantially in phase with the direct sound throughout the low frequency range. I have found that a considerably improved reproduction can be obtained, if this elimination of reflected sound that is out of phase with the direct sound can also be extended into the mid frequency range which carries more important information than the low frequency range.

It is an object of the present invention to provide a loudspeaker for stereophonic loudspeaker systems intended to be placed on the floor and close to a wall, in which the distortion due to reflected sound from the floor and the wall is substantially reduced.

It is another object of the present invention to provide a loudspeaker of the above type, in which the reflected sound from the floor and the wall is made to arrive substantially in phase with the direct sound up to at least 800 Hz, and preferably up to about 1 kHz and in some cases up to 1.5 kHz.

It is still another object of the present invention to provide a loudspeaker of the above type, in which the higher frequencies up to substantially 4 kHz are radiated in such a way as to reduce the amount of reflected sound from the wall and the floor, preferably without reducing the amount of early reflected sound from the other walls of the room and from the ceiling.

The above-mentioned objects are achieved with a loudspeaker for stereophonic loudspeaker systems, comprising a casing having a frontal wall, a side wall, a top wall, a substantially vertical rear wall and a substantially horizontal bottom wall, a first number of loudspeaker units arranged in the casing for radiating the lower frequency ranges, at least one of said first number of loudspeaker units being located near one or both of said rear and bottom walls, and a second number of loudspeaker units arranged near the rearmost part of the said top wall for radiating the higher frequency ranges and oriented so as to have its axis of radiation or their axes of radiation directed slantwise forwards to intersect an imaginary plane flush with said side wall, said loudspeaker being characterized in that said first number of loudspeaker units is arranged to be the sound source for at least the frequency range from 50 to 800 Hz and to have its outlet or outlets for frequencies above 50 Hz located at one or both of said frontal and side walls, at least one of said first number of loudspeaker units being arranged in the said side wall for radiating a low frequency range including the range from 50 to 150 Hz, at least one of said first number of loudspeaker units being arranged close to said bottom wall and at a substantial distance from one of said frontal and side walls for radiating a mid frequency range including the range from 300 to 800 Hz through an outlet at the other of said frontal and side walls and preferably having at least one loudspeaker unit located close to a substantially vertical casing structure wall arranged to protrude so as to restrict the rearward radiation of the loudspeaker in said mid frequency range.

With an aim to clarify, but not to limit, the invention, a number of embodiments will be described with reference to the accompanying drawings.

FIG. 1 is an exploded perspective view of a loudspeaker according to the invention for a frequency range from 20 to 20,000 Hz, in which the frequency range from 20 to between 800 and 1000 Hz is radiated by a single loudspeaker unit for the lower frequencies and a single loudspeaker unit for the higher frequencies.

Figure 1:
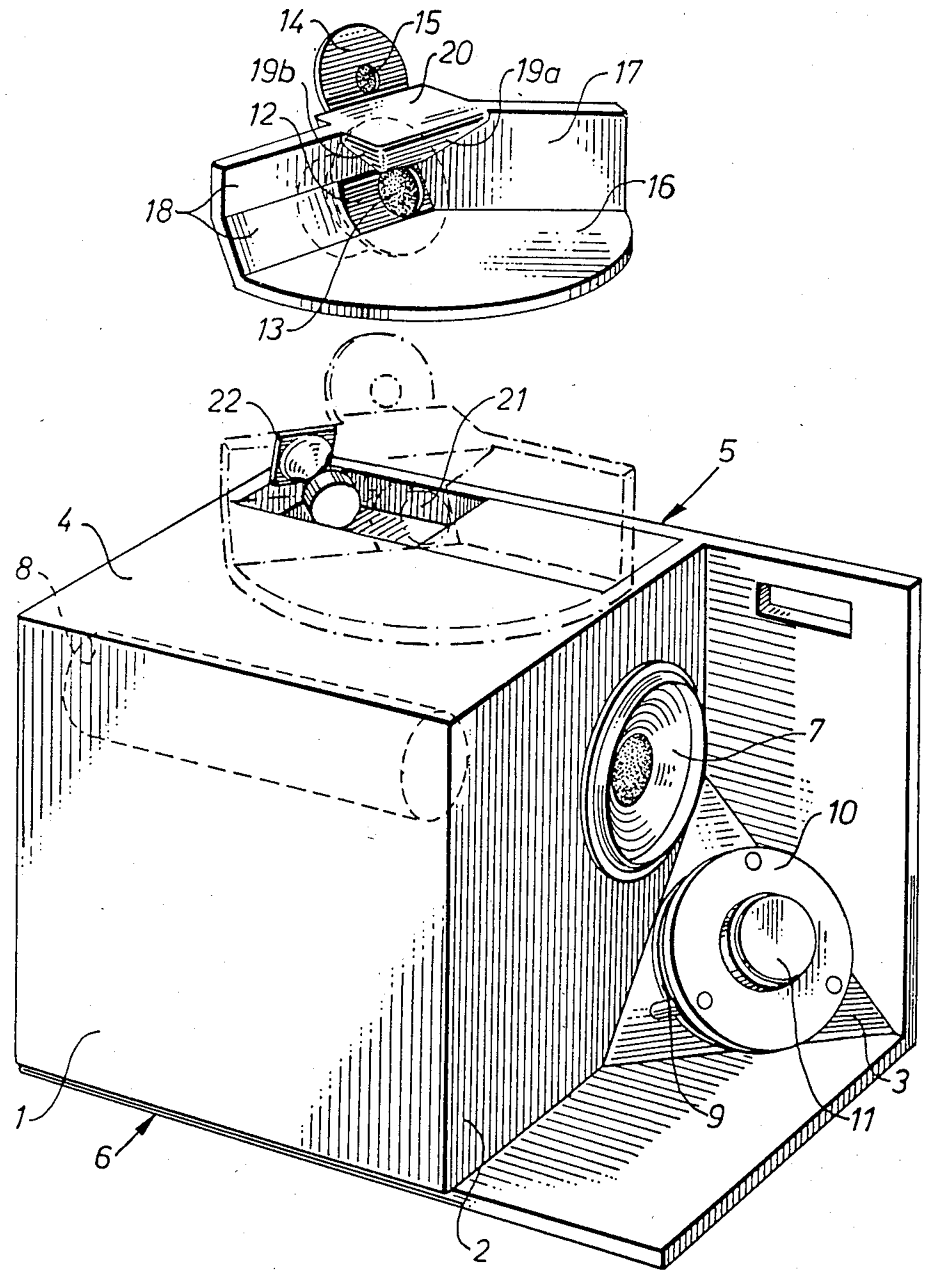

The different embodiments of the loudspeaker shown in FIGS. 1, 3, 4 and 5 have a casing with a frontal wall 1, a side wall 2, a top wall 4, a rear wall 5 and a bottom wall 6. They are the left-hand loudspeakers of a mirrorimage pair of stereophonic loudspeakers such as the left-hand loudspeaker 23 and the right-hand loudspeaker 24 shown in FIG. 2 and are intended to be placed with the bottom walls 6 against the floor, preferably with a thick carpet or felt as a spacer, and with the rear walls 5 close to and virtually flush with a wall 25 of a room.

Figure 3:
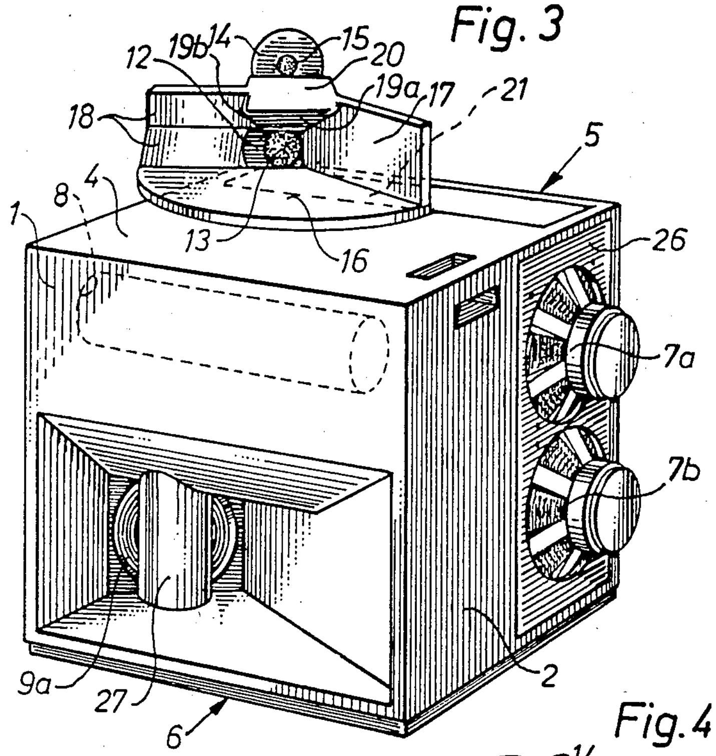
FIG. 3 is a perspective view of a second embodiment of a loudspeaker according to the invention in which the frequency range from 20 to between 800 and 1000 Hz is radiated by a group of loudspeaker units for the lower frequencies and a single loudspeaker unit for the higher frequencies.

In the embodiments of the loudspeaker shown in FIGS. 1 and 3, a loudspeaker unit 7 (FIG. 1) or a group of loudspeaker units, of which the two units **7*a* and 7*b* (FIG. 3) are visible from the outside, is arranged in the side wall 2, and reproduces sound throughout at least the range 50 Hz to 150 Hz. The loudspeaker 7 or loudspeakers 7*a* and 7*b* are arranged so as to cooperate with a large part of the internal volume of the casing and with a ducted port 8, and so as to be the sound source for the low frequencies including the range from 50 to 150 Hz and extending up to between 150 and 250 Hz or up to between 200 and 300 Hz, respectively. (The ducted port 8 is arranged to be a sound radiating surface below 50 Hz.) Higher frequencies including the range from 300 to 800 Hz and extending up to between 800 and 1000 Hz are radiated by a loudspeaker unit 9 or 9***a*, respectively, arranged to co-operate with a smaller part of the internal volume of the casing and mounted close to a vertical casing structure wall which protrudes so as to restrict the rearward radiation of the loudspeaker. In the embodiment shown in FIG. 1 the rear wall 5 and the bottom wall 6 of the casing extend past the side wall 2 so as to form with the side wall 2 a short conical horn with a solid angle of $\pi/2$ steradians. The side wall 2 has a triangular outwardly inclined portion 3 with an opening receiving the loudspeaker unit 9 mounted as close as possible to the three walls 2, 5 and 6 of said horn, said unit 9 having its back and its magnet structure 11 facing outwards. A mounting collar 10 increases the efficiency of the loudspeaker unit 9 in the frequency range 400–1000 Hz, and a moderating layer of sound absorbing material, e.g. soft felt, is provided below and around the mounting collar 10 (but not shown). In the embodiment shown in FIG. 3 the loudspeaker unit 9*a* is arranged at the smaller end of a horn-type passage having its mouth in the frontal wall 1. A separate, e.g. semicylindrical member 27 has a similar acoustic function as the mounting collar 10 above, and it is also provided with soft felt (not shown).

In a simplified version of the embodiment shown in FIG. 3 a wall member 26 holding said group of loudspeaker units for the low frequencies is replaced by another wall member of the same size which holds a single loudspeaker mechanism in the same position as the loudspeaker unit 7*b*.

Figure 4:
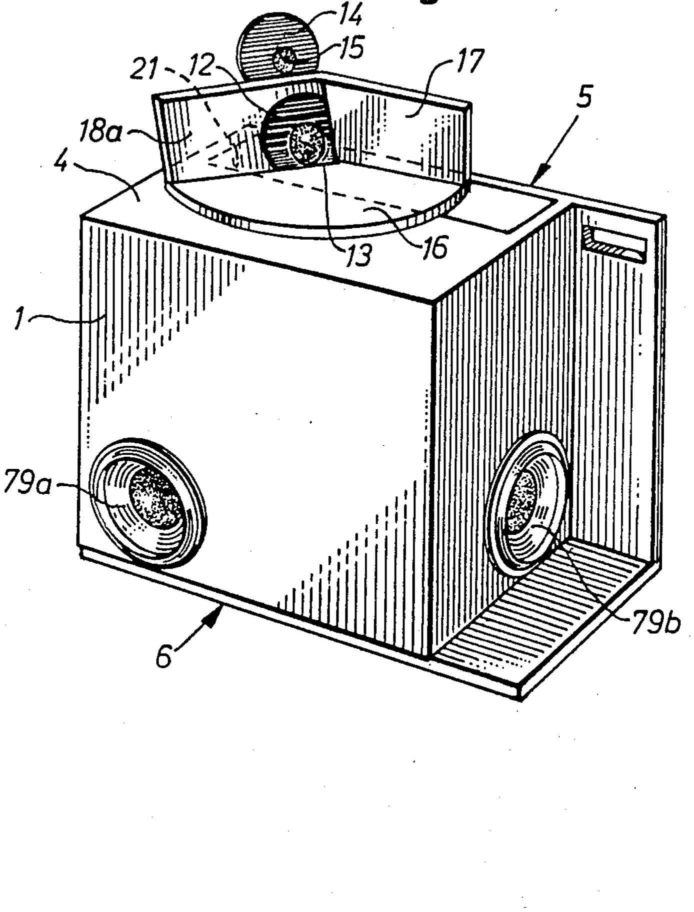
FIG. 4 is a perspective view of another embodiment of a loudspeaker according to the invention in which the low frequency range up to between 800 and 1000 Hz is radiated by two loudspeaker units.
Figure 5:
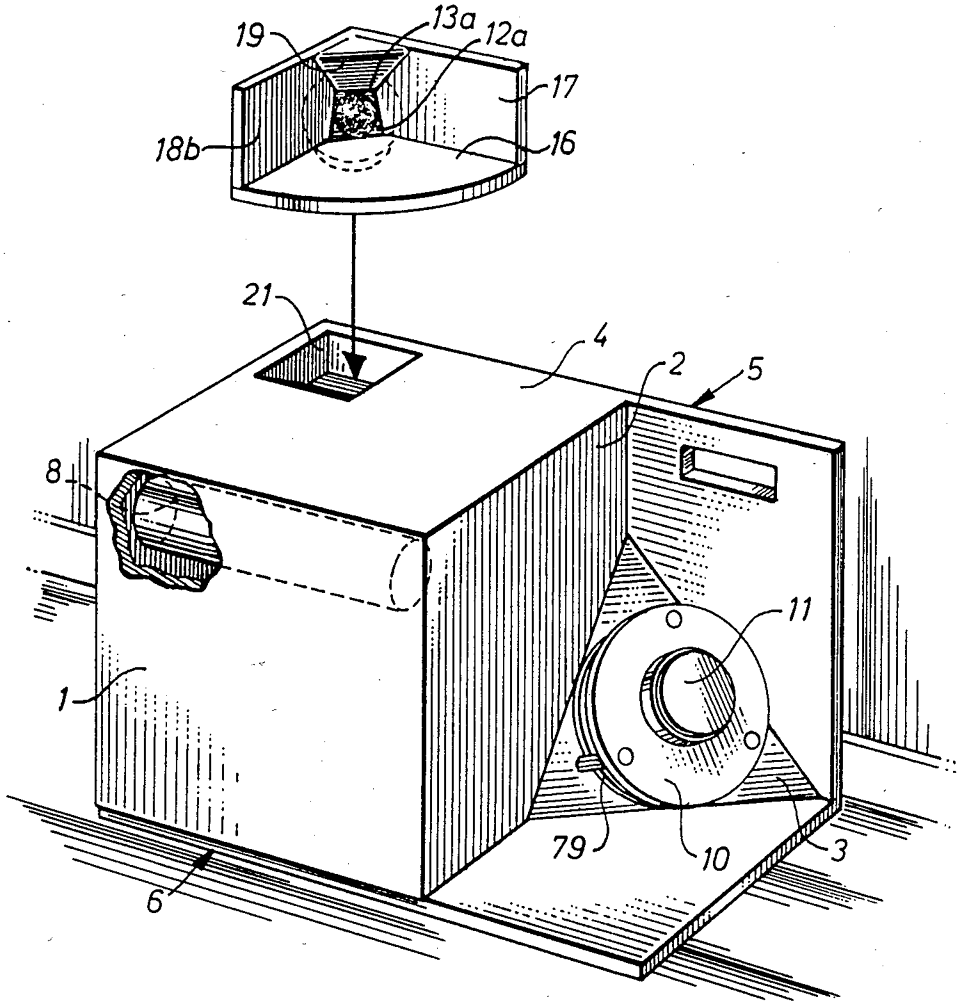
FIG. 5 is a perspective view of still another embodiment of a loudspeaker according to the invention in which the low frequency range up to between 800 and 1500 Hz is radiated by a single loudspeaker unit.

In the embodiments of the loudspeaker shown in FIGS. 4 and 5 the rear wall 5 and the bottom wall 6 extend from 0.1 to 0.3 m past the side wall 2. Two loudspeaker units 79*a* and 79*b* or a single loudspeaker unit 79 is or are mounted close to the bottom wall 6 and arranged so as to cooperate with the internal volume of the casing (in the embodiment shown in FIG. 5 cooperating with a ducted port 8), and so as to be the sound source for low and mid-range frequencies including the range from 50 to 800 Hz and extending up to between 800 and 1000 Hz or up to between 800 and 1500 Hz, respectively. In the embodiment shown in FIG. 4 the loudspeaker unit 79*a* is mounted in the frontal wall 1 and at a substantial preferably maximum distance from the side wall 2, whilst the loudspeaker unit 79*b* is mounted in the side wall 2 and close to the rear wall 5. In the embodiment shown in FIG. 5 the side wall 2 has an outwardly inclined portion 3 in which the loudspeaker unit 79 is mounted as described above in connection with the loudspeaker unit 9 of the embodiment shown in FIG. 1. The inclined portion 3 forms an angle of between 30 and 60 degrees with respect to rest of the said side wall and between 45 and 90 degrees with respect to the said rear wall and with respect to the said bottom wall of the casing. A loudspeaker unit 79 with an outside diameter of 0.18 m has a frequency range extending to about 1500 Hz.

In the embodiment shown in FIGS. 1, 3 and 4 a loudspeaker unit 12 with a dome-shaped diaphragm 13 is arranged to radiate the frequency range from between 800 or 1000 Hz and up to between 3 and 5 kHz. The diaphragm 13 is arranged to cooperate with a horn-type structure comprising a lower reflector surface 16 and two side reflector surfaces 17 and 18 or 18*a*. The side reflector surface 17 forms an angle of about 45 degrees with an imaginary plane which includes the axis of radiation of the diaphragm 13 and extends at right angles to the lower reflector surface 16. The side reflector surface 18 or 18*a* forms an angle of about 90 degrees with the same imaginary plane. In the embodiments shown in FIGS. 1 and 3 said horn-type structure also includes two upper reflector surfaces 19*a* and 19*b* which restrict the vertical angle of aperture to about 45 degrees with respect to the lower reflector surface 16.

The function of the vertical asymmetry of the said horn-type structure is to provide early reflected sound from the ceiling in addition to the direct sound towards the listening area, whilst the function of the horizontal asymmetry is to add early reflected sound from both side walls in the listening room. The height of the reflector surfaces 17 and 18 or 18*a* is about 0.1 to 0.15 m, but they should have a length-to-height ratio of about 1.5 to 2.5 in order to minimize interference due to reflected sound from the wall 25 in FIG. 2.

In the embodiment shown in FIG. 5 higher frequencies than those radiated by the loudspeaker unit 79 are radiated by a loudspeaker unit 12*a* having a dome-shaped diaphragm 13*a* arranged to cooperate with a horizontally symmetrical horn-type structure comprising a lower reflector surface 16, two side reflector surfaces 17 and 18*b* and an upper reflector surface 19.

In the embodiments shown in FIGS. 1, 3 and 4 a loudspeaker unit 14 with a dome-shaped diaphragm 15 is arranged to radiate the high frequency range from between 3 and 5 kHz. It is mounted directly above the loudspeaker unit 12 and has its diaphragm 15 located close to the upper end of the side reflector surface 18 or 18*a* of said horn-type structure. In the embodiments shown in FIGS. 1 and 3 the diaphragm 15 cooperates with a substantially horizontal reflector surface 20.

The so formed horn-type assemblies 12–20, 12–18*a* and 12*a*–19 shown in FIGS. 1, 3, 4 and 5 are arranged so as to be turnable on the top wall 4 of the loudspeaker casing which has a recess 21 for receiving the loudspeaker unit 12 or 12*a*. The embodiment shown in FIG. 1 includes an additional horn-type loudspeaker unit 22 arranged in the said recess 21 for radiating the frequency range 2–20 kHz and oriented backwards-upwards-sidewards to provide additional early reflected sound from the side walls and the ceiling of the listening room.

Figure 2:
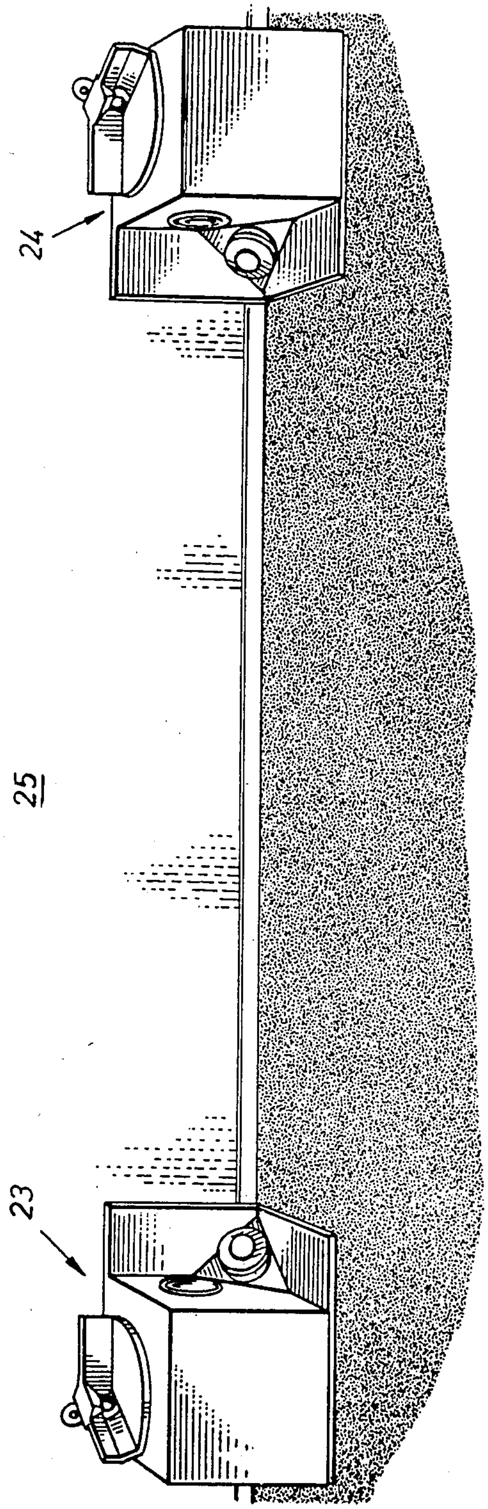
FIG. 2 is a perspective view of a stereophonic loudspeaker system consisting of two loudspeakers according to FIG. 1, positioned on the floor and close to a vertical wall of a room.

A preferred modification (not shown) of the embodiments shown in FIGS. 1, 3 and 4 includes a wall reflex absorber to primarily attenuate the sound from the diaphragm 15 that is reflected by the wall 25 in FIG. 2. Such a wall reflex absorber is included in a loudspeaker shown in FIG. 4 of a simultaneously filed patent application corresponding to my Swedish patent application 8107050-0.

In further embodiments (not shown) of the invention said horn-type assemblies (and said wall reflex absorbers) are replaced by any of the loudspeakers shown in FIGS. 1 and 5 of said simultaneously filed patent application, arranged for radiating only frequencies higher than 800 to 1000 Hz.

I claim:

1. A loudspeaker for a stereophonic loudspeaker system for producing acoustical output over a range of frequencies comprising a casing forming an acoustical enclosure having a frontal wall, a side wall, a top wall, a substantially vertical rear wall, and a substantially horizontal bottom wall, a first loudspeaker unit arranged in the casing for radiating the lower frequencies of said range located on said side wall near said rear wall, and a second loudspeaker unit arranged near the rearmost part of said top wall for radiating the higher frequencies of said range and being oriented with its axis of radiation directed slantwise forwards to intersect an imaginary plane flush with said side wall characterized in that said first loudspeaker unit is disposed adjacent to said bottom wall and at a substantial distance from said frontal wall.

2. A loudspeaker as claimed in claim 1 wherein said first loudspeaker unit has a frequency response range which includes the range from 50 to 150 Hz, said casing comprising structure means forming a horn-type passage having its mouth in the lower part of the said frontal wall, a third loudspeaker unit being arranged at the smaller end of said horn-type passage for radiating an intermediate frequency range which includes the range from 300 to 800 Hz, said casing structure means forming said horn-type passage restricting the rearward radiation of the loudspeaker in the said 300 to 800 Hz range.

3. A loudspeaker as claimed in claim 1 werein said first loudspeaker unit has a frequency response range which includes the range from 300 to 800 Hz, the said rear wall of the casing being extended between 0.1 and 0.3 m past the said side wall of the casing and protruding so as to restrict the rearward radiation of the loudspeaker in the said 300 to 800 Hz range.

4. A loudspeaker as claimed in claim 3 wherein the said side wall of the casing has a triangular portion inclined between 30 and 60 degrees with respect to the rest of the said side wall and between 45 and 90 degrees with respect to the said rear wall and with respect to the said bottom wall of the casing, said triangular portion having an opening receiving said first loudspeaker unit.

5. A loudspeaker as claimed in claim 1 wherein means forming a horn-type structure are arranged on the said top wall of the casing, said horn-type structure comprising a substantially horizontal lower reflector surface and two side reflector surfaces, said second loudspeaker unit being mounted to the narrow end of the said horn-type structure, the wide end of the said horn-type structure transmitting the sound in forwardly and sidewardly and upwardly directions.

6. A loudspeaker as claimed in claim 5, wherein the said top wall horn-type structure is arranged to have a wide vertical angle of aperture, above said lower reflector surface, preferably amounting to substantially 45 degrees, said side reflector surfaces having a length-to-height ratio substantially between 1.5 and 2.5.

7. A loudspeaker as claimed in claim 5, wherein the said top wall horn-type structure is asymmetric with respect to an imaginary vertical plane which includes the axis of radiation of the said second loudspeaker unit, and has an angle of substantially 45 degrees between one of said side reflector surfaces and the said imaginary vertical plane, and an angle of substantially 90 degrees between the other side reflector surface and the same imaginary vertical plane, the side reflector surface with the smaller angle being located nearest to the said side wall of the casing.

8. A loudspeaker as claimed in claim 2 wherein means forming a horn type structure are arranged on the top wall of the casing, said horn type structure comprising a substantially horizontal lower reflector surface and two side reflector surfaces, said second loudspeaker unit being mounted at the narrow end of said horn type structure.

9. A loudspeaker as claimed in claim 4 wherein means forming a horn type structure are arranged on the said top wall of the casing, said horn type structure comprising a substantially horizontal lower reflector surface and two side reflector surfaces, said second loudspeaker unit being mounted to the narrow end of said horn type structure.

10. A loudspeaker for use in a stereophonic sound reproducing system and intended to be placed on a horizontal support, said loudspeaker comprising a casing having a bottom wall, a rear wall, a side wall and a top wall, said bottom wall being substantially horizontal and said rear wall being substantially vertical, a first electroacoustical loudspeaker unit mounted on the said side wall of the casing and located close to the said rear and bottom walls of the casing and adapted to radiate a frequency range which includes the range from 300 to 800 Hz, the said rear and bottom walls of the casing being extended between 0.1 and 0.3 m past the said side wall of the casing so as to restrict the rearward and downward radiation of the loudspeaker in the said frequency range, the said side wall and the said extensions of the rear and bottom walls of the casing forming a short conical horn with a solid angle of substantially $\pi/2$ steradians, and a second electroacoustical loudspeaker unit mounted near the rearmost part of the said top wall of the casing and adapted to radiate a higher frequency range, said second electroacoustical loudspeaker unit having an acoustical axis of radiation, the said acoustical axis of radiation being directed slantwise forwards to intersect an imaginary vertical plane which plane extends at right angles to the said rear wall of the casing and touches the said side wall of the casing.

11. A loudspeaker as claimed in claim 10 wherein the said side wall of the casing has a triangular portion near the said rear and bottom walls of the casing which triangular portion is inclined between 30 and 60 degrees with respect to the rest of the said side wall and between 45 and 90 degrees with respect to the said rear and bottom walls, said triangular portion having an opening receiving said first electroacoustical loudspeaker unit.

12. A loudspeaker as claimed in claim 10 wherein means forming a horn type structure are arranged on the said top wall of the casing, said horn type structure comprising a substantially horizontal lower reflector surface and two side reflector surfaces, and said second electroacoustical loudspeaker unit being mounted to the narrow end of the said horn type structure.

13. A loudspeaker as claimed in claim 3 wherein the frequency response range of said first loudspeaker unit includes the range from 50 to 150 Hz.

14. A loudspeaker as claimed in claim 3 wherein an additional loudspeaker unit is arranged in the said casing for radiating the lower frequencies, said additional loudspeaker unit being mounted on the said side wall and having a frequency response range which includes the range from 50 to 150 Hz.

15. A loudspeaker for use in a stereophonic sound reproducing system and intended to be placed on a horizontal support, said loudspeaker comprising a casing having a bottom wall, a rear wall, a side wall and a top wall, said bottom wall being substantially horizontal and said rear wall being substantially vertical, a first electro-acoustical loudspeaker unit mounted on the said side wall of the casing and located close to the said rear and bottom walls of the casing and adapted to radiate a frequency range which includes the range from 300 to 800 Hz, the said rear wall of the casing being extended past the said side wall of the casing and protruding so as to restrict the rearward radiation of the loudspeaker in the said frequency range, means forming a horn-type structure comprising a lower reflector surface and two side reflector surfaces, said horn-type structure being arranged on the said top wall of the casing and having its narrow end located near the rearmost part of the said top wall of the casing and having its lower reflector surface substantially horizontal, and a second electro-acoustical loudspeaker unit mounted to the narrow end of the said horn-type structure and adapted to radiate a higher frequency range, said second electro-acoustical loudspeaker unit having an acoustical axis of radiation, said acoustical axis of radiation being directed slantwise forwards to intersect an imaginary vertical plane which plane extends at right angles to the said rear wall of the casing and touches the said side wall of the casing, the wide end of the said horn-type structure transmitting the said higher frequency range in forwardly and sidewardly and upwardly directions.

16. A loudspeaker for use in a stereophonic sound reproducing system and intended to be placed on a horizontal support, said loudspeaker comprising a casing having a bottom wall, a rear wall, a side wall and a top wall, said bottom wall being substantially horizontal and said rear wall being substantially vertical, a first electro-acoustical loudspeaker unit being mounted on the said casing and located close to the said rear and side walls of the casing and adapted to radiate a low frequency range, means forming a horn-type structure comprising a lower reflector surface, two side reflector surfaces and a smaller upper reflector surface, said horn-type structure being arranged on the said top wall of the casing and having its narrow end located near the rearmost part of the said top wall of the casing and having its lower reflector surface substantially horizontal, said lower and upper reflector surfaces forming a vertical angle of aperture of approximately 45 degrees, said side reflector surfaces having a length to height ratio between 1.5 and 2.5, and a second electro-acoustical loudspeaker unit mounted to the narrow end of the said horn-type structure and adapted to radiate a higher frequency range, said second electro-acoustical loudspeaker unit having an acoustical axis of radiation, the said acoustical axis of radiation being directed slantwise forwards to intersect an imaginary vertical plane which plane extends at right angles to the said rear wall of the casing and touches the said side wall of the casing, the wide end of the said horn-type structure transmitting the said higher frequency range in forwardly and sidewardly and upwardly directions.

17. A loudspeaker as claimed in claim 1 wherein an additional loudspeaker unit is arranged for radiating the lower frequencies, said additional loudspeaker unit being disposed adjacent to said bottom wall at a substantial distance from said side wall and having a sound outlet in said frontal wall.

18. A loudspeaker as claimed in claim 17 wherein said first loudspeaker unit and said additional loudspeaker unit for the lower frequencies have a frequency response range which includes the range from 50 to 800 Hz, said additional loudspeaker unit being mounted on said frontal wall of the casing, means forming a horn-type structure comprising a substantially horizontal lower reflector surface and two side reflector surfaces being arranged on the said top wall of the casing, said second loudspeaker unit being mounted to the narrow end of the said horn-type structure.

* * * * *